(12) United States Patent
Chen et al.

(10) Patent No.: US 6,544,847 B2
(45) Date of Patent: Apr. 8, 2003

(54) SINGLE POLY NON-VOLATILE MEMORY STRUCTURE AND ITS FABRICATING METHOD

(75) Inventors: Chun-Lin Chen, Taoyuan (TW); Ting-S. Wang, Hsinchu Hsien (TW); Juinn-Sheng Chen, Tainan Hsien (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/915,928

(22) Filed: Jul. 26, 2001

(65) Prior Publication Data

US 2001/0049170 A1 Dec. 6, 2001

Related U.S. Application Data

(62) Division of application No. 09/383,373, filed on Aug. 26, 1999, now Pat. No. 6,324,097.

(51) Int. Cl.$^7$ .............................................. H01L 29/68
(52) U.S. Cl. ........................................................ 438/258
(58) Field of Search .......................................... 438/258

(56) References Cited

U.S. PATENT DOCUMENTS 5,604,700 A * 2/1994 Parrris et al. ................ 365/156
5,440,159 A * 8/1995 Larsen et al. ................ 257/300

* cited by examiner

*Primary Examiner*—Richard Elms
*Assistant Examiner*—Beth E. Owens

(57) ABSTRACT

The present invention discloses a method for fabricating a non-volatile memory structure from a single layer of polysilicon in a semiconductor substrate, wherein the semiconductor substrate with two active areas, first and second, are divided by isolation regions. In accordance with this method, a doped buried layer is formed in the first active area. Then, a first floating gate is formed on the buried layer and a second floating gate is formed on the second active area from the single layer of polysilicon. Next, two doped regions are formed at opposite sides of the second floating gate in the second active areas. Finally, a floating gate connection line is employed to connect the first and second floating gate for making sure that the two floating gates are in the same potential.

10 Claims, 5 Drawing Sheets

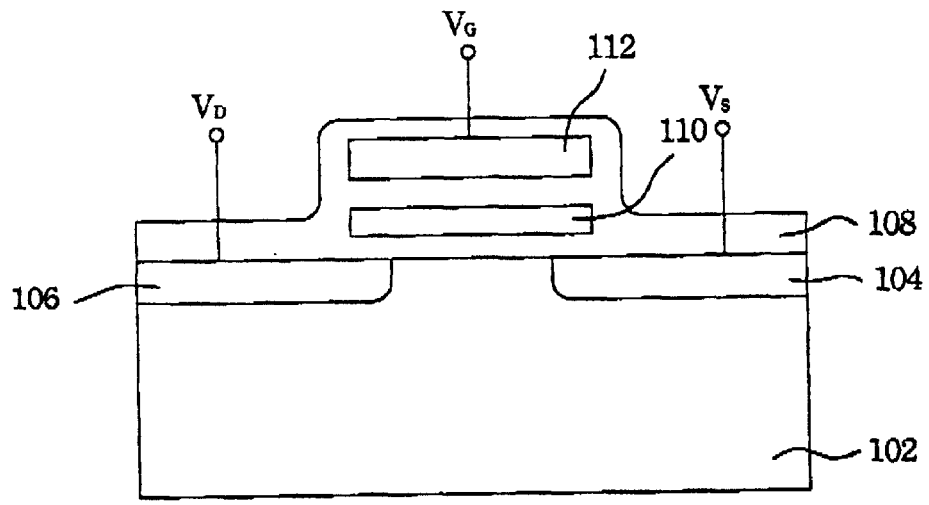
(Prior Art) Figure 1
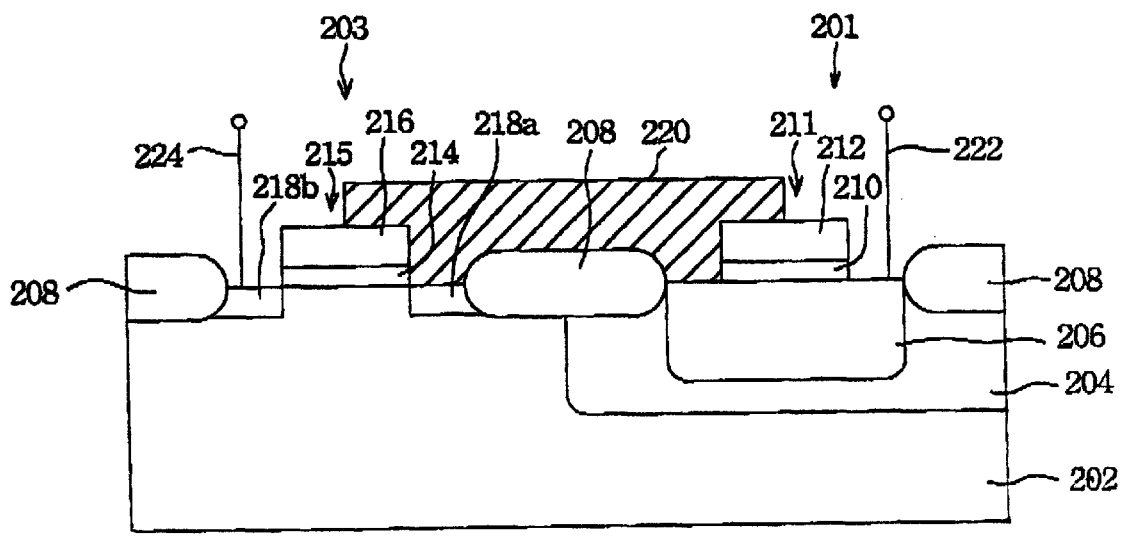
Figure 2

SINGLE POLY NON-VOLATILE MEMORY STRUCTURE AND ITS FABRICATING METHOD

This is a division of U.S. patent application Ser. No. 09/383,373, filed Aug. 26, 1999, now U.S. Pat. No. 6,324,097 issued Nov. 27, 2001.

FIELD OF THE INVENTION

The present invention relates to a non-volatile memory structure formed in and on a semiconductor substrate. More particularly, the invention relates to a non-volatile memory structure with a single layer of polysilicon gate and a method for fabricating the structure.

BACKGROUND OF THE INVENTION

A non-volatile memory cell, a widely used semiconductor device, is capable of preserving digital information without supply of electric power. An erasable programmable ROM (EPROM), one of the non-volatile memory cells fabricated based on a semiconductor substrate, preserves digital information by trapping electrons in its floating gate when some electrodes of the EPROM are biased in desired levels. The electrons trapped in the floating gate of EPROM could be evacuated to erase the preserved information by exposing the EPROM in an environment with a high dose of ultraviolet. Since the EPROM has the feature of repeatedly recording information in a state out of supply of electric power, it is employed in many electronic devices nowadays.

Referring to FIG. 1, a typical EPROM cell is fabricated on a silicon substrate 102 doped with P-type impurities, such as B, BF2+. A silicon dioxide layer 108 formed on the surface of the P-substrate 102 encompasses a floating gate 110 and control gate 112, in which the two gates are insulated by the silicon dioxide layer 108. A source region 104 and drain region 106 doped with N-type impurities, such as P, As, are embedded at opposite two sides of the floating gate 110 in the P-type substrate 102. When recording information in the EPROM cell, the control gate 112 and drain region 106 are biased in a high voltage level, meanwhile the source region 104 and substrate 102 being electrically connected to ground, to drive electrons ejecting from the source region 104 through the silicon dioxide layer 108 into the floating gate 110. The silicon dioxide layer 108 would construct a potential barrier so as to trap the electrons in the floating gate 110. Because of the electrons trapped in the floating gate, when the control gate 112 is biased to its original threshold voltage level, the channel between the source region 104 and drain region 106 will not be normally turned on, therefore regarding this state as "1". Contrarily, if the EPROM cell doesn't be biased to eject electrons into the floating gate 110, the channel between the source region 104 and drain region 106 will be turned on, as long as the control gate 112 is biased to its threshold voltage level. Such a state would be regard as "0".

To erase the preserved information, it is necessary expose the EPROM to an ultraviolet environment for providing the trapped electrons enough energy to escape from the potential barrier of the silicon dioxide layer 108. By applying the erasing and recording procedures, the EPROM cell can be repeatedly performed to preserve digital information.

Commonly, the EPROM cell includes two stacked gates, the control gate 112, and floating gate 110. To approach the two gates, it needs more complicated fabricating processes to form the two-layer structure. For forming an EPROM chip, EPROM cells are always designed in association with logic devices, such as MOSFET, CMOSFET, and so on. However, the MOSFET and CMOSFET are both one-layer structures with fewer lithographic masks than those of the EPROM cells, so as to make the fabricating processes of the EPROM cell being somewhat incompatible from that of the MOSFET and CMOSFET. For fitting the fabricating processes of the EPROM cell, the processes of the EPROM chip would become costly and complicated.

The traditional EPROM cell could provide a high integration, but in some cases the EPROM chip doesn't need such a high integration but concerns more about the cost and simplicity of fabricating processes. Under this concern, the present invention demonstrates a single poly non-volatile memory structure and its fabricating method for improving the disadvantages existed in the prior art.

SUMMARY OF THE INVENTION

A first object of the invention is to provide a non-volatile memory structure with a single-layer poly gate design for simplifying the fabricating processes of the structure so as to fit the processes with those of logic devices, such as MOSFET and CMOSFET.

A second object of the invention is to provide a method to approach the single polysilicon non-volatile memory structure.

The present invention provides a single poly non-volatile memory structure including a P-type doped semiconductor substrate, in which an N-well is formed, divided into two active areas by isolation regions. A control gate is embedded in the first active area by implanting N-type impurities into the N-well. A first floating gate as well as a second floating gate are formed on the control gate and the second active area through subsequently stacking an oxide, polysilicon, and silicide layers on the substrate, and then etching the oxide-polysilicon-silicide composite layer. Two doped regions are formed at opposite two sides of the second floating gate in the second active area by implanting N-type impurities. A floating gate line is formed to electrically connect the first floating gate and second floating gate for making sure that they would keep in the same potential. When the control gate is biased to a voltage level, the voltage level would be coupled to the first floating gate so as to keep the second floating gate in the same potential with the first floating gate. While one of the doped regions is biased to a voltage level, electrons would eject from the other doped region and be trapped in the floating gates, thereby preserving information in this memory structure.

BRIEF DESCRIPTION OF THE DRAWINGS

FIG. 1 is a cross-sectional side view of a traditional EPROM cell;

FIG. 2 is a cross-sectional side view of a single poly non-volatile memory structure according to the invention;

DETAILED DESCRIPTION OF THE PREFERRED EMBODIMENT

Figure 3:
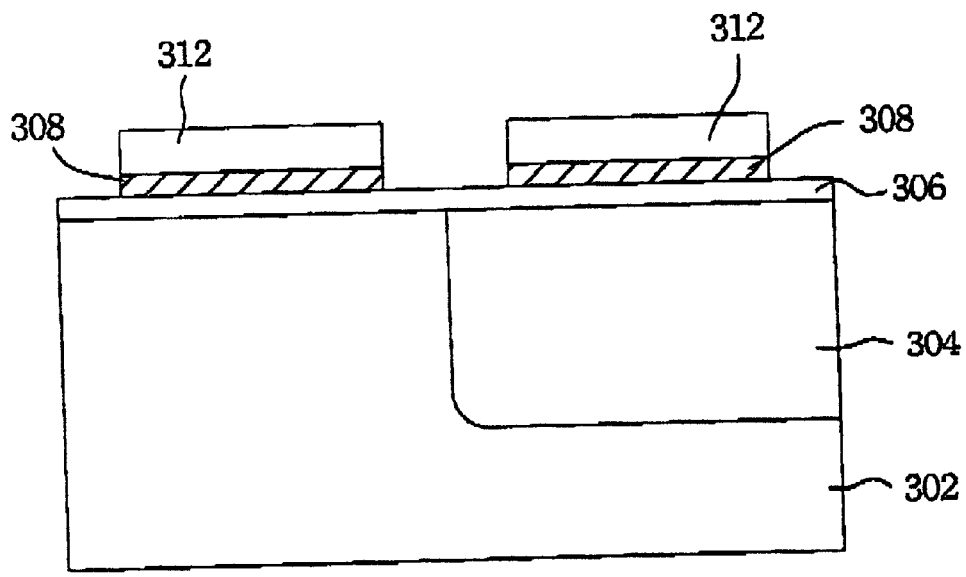
FIG. 3 illustrates a cross-sectional side view of a semiconductor substrate with an N-well.

The present invention provides a non-volatile memory structure with a single polysilicon gate layer design for improving the disadvantages of relatively high costs and complicated fabricating processes. A cross-sectional side view of the non-volatile memory structure is described first for clarifying the mechanism of the structure. Afterward, an embodiment of fabricating processes will be illustrated to approach the single poly non-volatile structure.

As shown in FIG. 2, a single poly non-volatile memory structure is established in and on a semiconductor substrate 202 doped with P-type impurities, in which an N-well 204 is formed. A doped buried layer 206 is embedded in the N-well 204 for servicing as a control gate with a higher dosage of N-type impurities than that of N-well 204. The semiconductor substrate 202 is divided into a first active area 201 and second active area 203 by isolation regions 208. A first oxide layer 210 and first gate electrode 212 are subsequently formed upon the first active area 201 to construct a first floating gate 211. Similarly, a second floating gate 215 is constructed by forming a second oxide layer 214 and gate electrode 216. Beneath the opposite two sides of the second floating gate 215, a first doped region 218a and second doped region 218b are formed in the second active area 203 to establish a channel between them by implanting N-type impurities. A floating gate line 220 connects the first floating gate 211 with the second floating gate 215 for balancing the two gates in a same potential while each of them varying in voltage levels.

For recording information, the control gate 206 is biased through a word line 222 connected thereon. Since the first gate electrode 212, first oxide layer 210, and control gate 206 could be regarded as a capacitance, the potential of the control gate 206 biased through the word line 222 will be coupled to the first gate electrode 212 and hold the second gate electrode 216 in the same potential of the first floating gate 211. In addition, the potential of the first floating gate 211 could be achieved in different efficiencies by adjusting the ratio between the areas of the first floating gate 211 and the control gate 206. If the voltage levels of the control gate 206 and second doped region 218b, which is biased through a bit line 224, are high enough, electrons would easily eject through the second oxide layer 214 into the second gate electrode 216 and be trapped in the first and second floating gates, thereby achieving the function of preserving information even without supply of external electric power. Similar to the prior art, when the single poly non-volatile memory structure exposed in an environment with a high dose of ultraviolet, the electrons trapped in the floating gates would escape from them and enable the memory structure to record information again.

FIG. 3 shows initial steps of an embodiment to approach the single ploy non-volatile memory structure. A semiconductor substrate 302 doped with P-type impurities is provided, in which a N-well 304 is formed by implanting N-type impurities, such as P, As. A pad oxide layer 306 is formed upon the surface of substrate 302 through a thermal oxidation treatment. Thereafter, a nitride layer 308 is deposited on the pad oxide preferably through a Low Pressure Chemical Vapor Deposition (LPCVD) method. For defining active areas, a photoresist layer 312 is patterned on the nitride layer 308 for serving as an etching mask through a lithography process. The nitride layer 308 is then etched until the pad oxide layer 306 is exposed.

Figure 4:
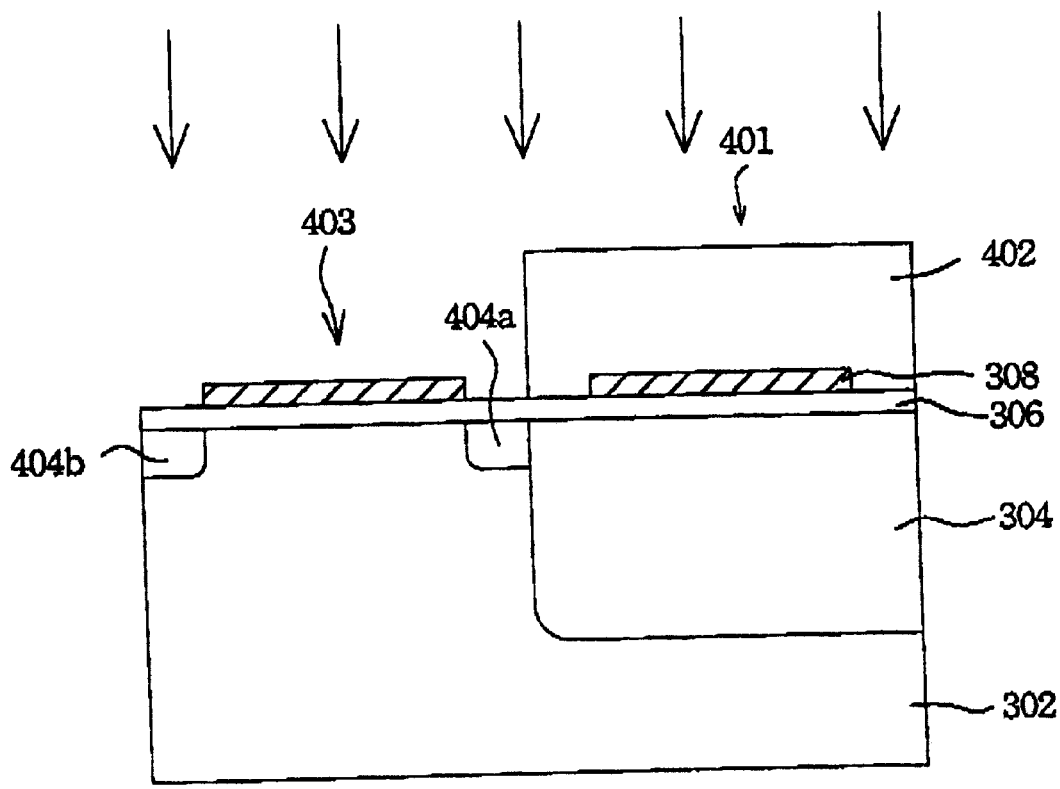
FIG. 4 illustrates a cross-sectional side view of the semiconductor substrate with channel stop implantation.
Figure 5:
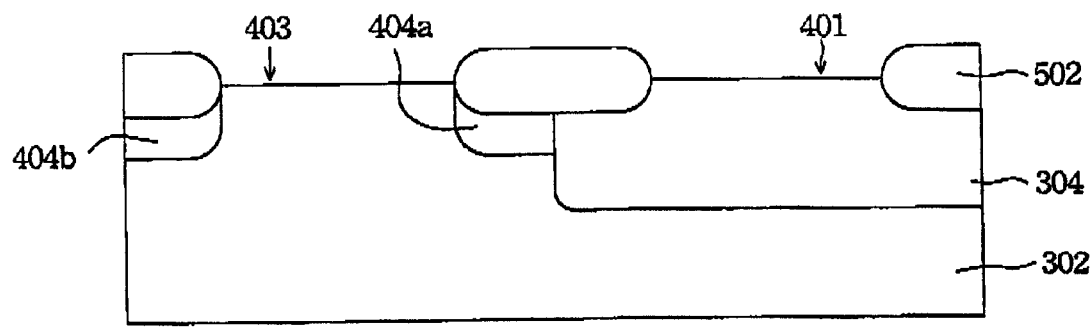
FIG. 5 illustrates a cross-sectional side view of the semiconductor substrate formed with isolation regions.

Referring to FIG. 4, after the nitride layer 308 is etched, the photoresist layer 312 (see FIG. 3) is stripped to remain parts of the nitride layer 308 for defining the active areas 401, 403. For completely isolating the active area 403 form the active area 401, a channel stop implantation is performed by patterning a photoresist layer 402 to mask the first active area 401 and implanting P-type impurities to form a first channel stop region 404a and second channel stop region 404b. After the implantation of the first and second channel stop regions 404a, 404b, the photoresist layer 402 is stripped and the substrate 302 is then thermally treated in an ambient with moisture and oxygen for growing thick field oxide layers (FOX) as isolation regions 502, as shown in FIG. 5. It's noticed that the nitride layer 308 (see FIG. 4) still exists on the surface of substrate 304, while performing the oxidation, for preventing moisture and oxygen penetrating into the substrate of active areas 401, 403. When the isolation regions, i.e. FOX, 502 are formed, nitride layer 308, and pad oxide layer 306 are subsequently removed from the surface of substrate 302.

FIG. 5 shows a cross-sectional side view of the substrate 302 with isolation regions 502. In this preferred embodiment, the combinations of isolation regions 502 and channel stop regions 404a, 404b are effective to suppress the interference between active areas 401 and 403, however there are still other alternatives, such as trench isolation is one of the widely used structures in this art.

Figure 6:
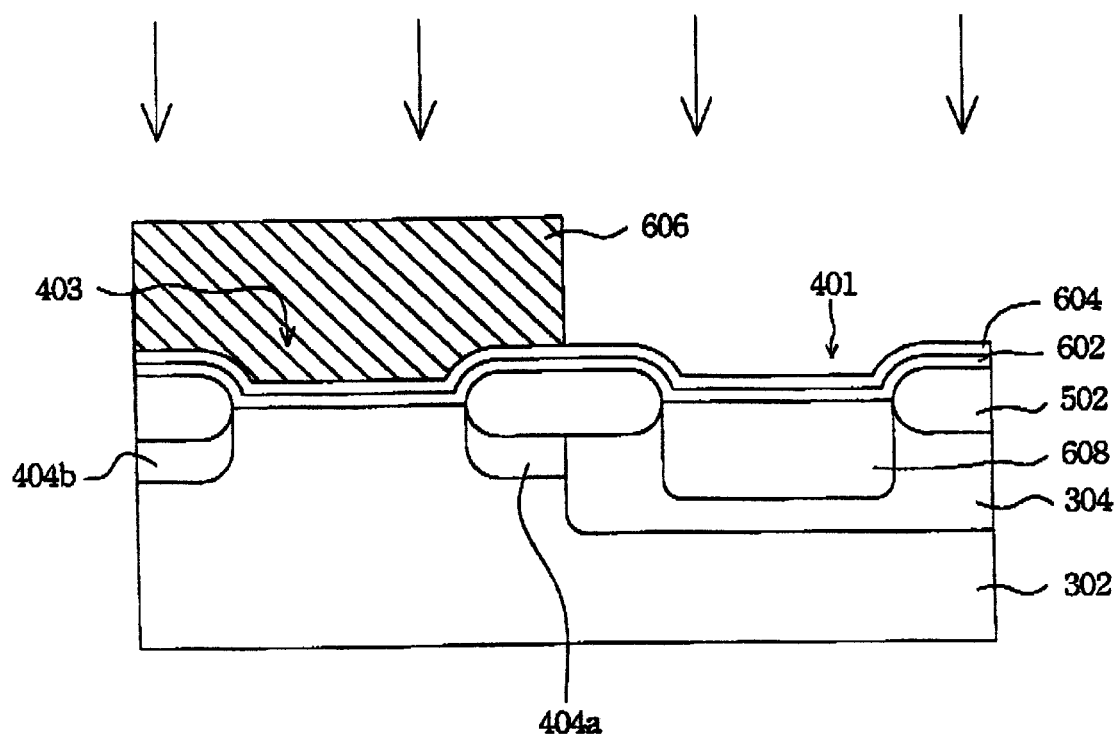
FIG. 6 illustrates a cross-sectional side view of the semiconductor substrate embedded with a doped buried layer and a stacked oxide layer and polysilicon layer.

Referring to FIG. 6, a gate oxide layer 602 is formed upon the surface of substrate 302 preferably through a dry oxidation process. A polysilicon layer 604 is formed upon the gate oxide layer 602 preferably through a Chemical Vapor Deposition (CVD) method. Thereafter, a photoresist layer 606 is patterned on the surface of polysilicon layer 604 to cover the second active area 403 for serving as a mask so as to prevent ions implanting into the second active area and allow to form a doped buried layer 608 in the first active area 401. In the implantation, a higher dosage of N-type impurities than that of the N-well 304 is employed to form the doped buried layer 608 with a better conductivity thereby serving as a control gate of the present single poly non-volatile memory structure. In this preferred embodiment, the dosage of N-type impurities of the doped buried layer is between about $1 \times 10^{15} \sim 2 \times 10^{15}$ cm$^{-2}$. It is noticed that, the buried layer could also be performed prior the deposition of the polysilicon layer 604, but it may trigger issues of degradation of conductivity of the buried layer 608 due to the high temperature during the deposition.

Figure 7:
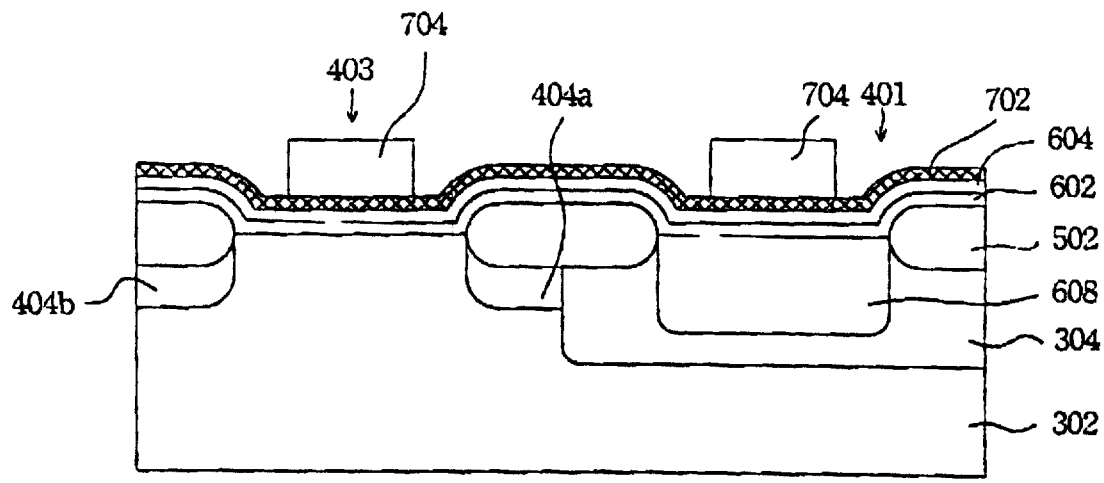
FIG. 7 illustrates a cross-sectional side view of the semiconductor substrate formed with a tungsten silicide layer upon the polysilicon layer.

Referring to FIG. 7, after the photoresist layer 606 is stripped (see FIG. 6), a tungsten silicide layer 702 is formed upon the polysilicon layer 604 for improving the conductivity of the formed floating gate electrodes. A photoresist layer 704 is formed on the surface of tungsten silicide layer 702 to define floating gates of first and second active areas. In this preferred embodiment, the tungsten silicide layer 702 is employed to deal with the resistance issues of the formed floating gate electrodes. However it's not the only option, a titanium suicide layer or cobalt suicide layer could also be one of the alternatives to substitute the tungsten silicide layer.

Figure 8:
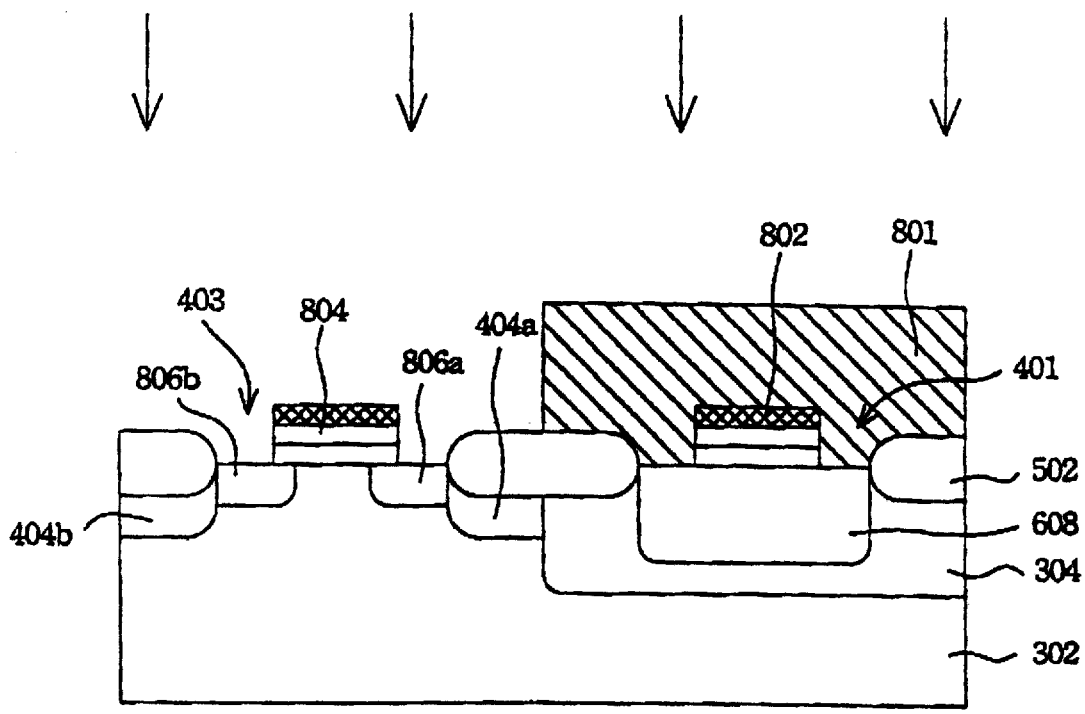
FIG. 8 illustrates a cross-sectional side view of the semiconductor substrate formed with two floating gates and source/drain regions.

Referring to FIG. 8, a first floating gate 802 and second floating gate 804 are form by etching the oxide/polysilicon/ silicide composite layer. Then, the photoresist layer 704 is stripped (see FIG. 7). Thereafter, a photoresist layer 801 is patterned to cover the surface of first active area 401 for serving as an implantation mask. For establishing a channel beneath the second floating gate, N-type impurities are implanted at opposite two sides of second floating gate 804 in the substrate 302 to form a first doped region 806a and second doped region 806b. In this preferred embodiment, the first and second doped regions 806a, 806b have a dosage between about $3\times10^{15}$~$4\times10^{15}$ cm$^{-2}$. However, in general cases the dosage could be tolerated in a region between about $8\times10^{12}$~$1.5\times10^{13}$ cm$^{-2}$.

Figure 9:
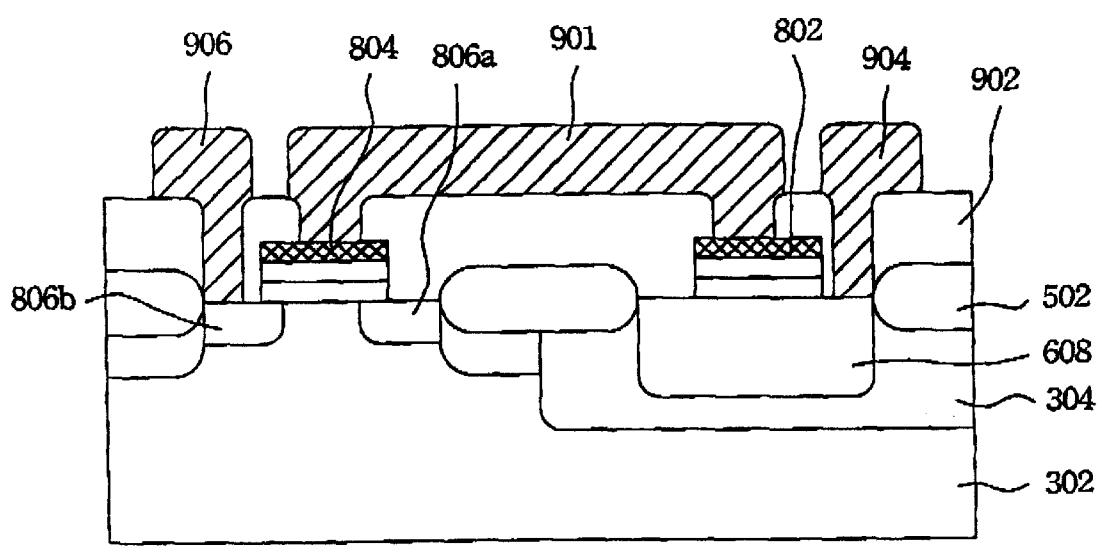
FIG. 9 illustrates a cross-sectional side view of the semiconductor substrate fabricated with a single poly non-volatile memory structure.

FIG. 9 shows an accomplished cross sectional side view of the single poly non-volatile memory structure. After the formation of the first floating gate 802 and second floating gate 804, the photoresist layer 801 is stripped. For achieving the present non-volatile memory structure, a dielectric layer 902 is formed on the surface of substrate 302. The dielectric layer 902 is preferred to be a material of phosphosilicate glass (PSG), and the PSG layer is suggested to reflow to smooth its surface. Through lithographic processes, several contact holes expose some areas of the control gate 608, first floating gate 802, second floating gate 804, and the second doped region 806b. A conductive layer is then coated upon the dielectric layer and exposed areas, through patterning processes, thereby a connection line 901 is formed to respectively connect with the first floating gate 802 and the second floating gate 804, and forming a plug 904 contacting with the control gate 608 for connecting a word line and the other plug 906 contacting with the second doped region 806b for connecting a bit line.

Since the present memory structure has only one-layer gate design, its fabricating processes would be easily fitted with those of logic devices, such as MOSFET and CMOSFET. Although this structure would decrease the integration of a integrated circuit, in some cases of memory chips in which the integration is not a crucial issue, this structure would effectively simplifying fabricating processes and saving manufacturing costs.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for fabricating a non-volatile memory structure from a single layer of polysilicon comprising the following steps:

providing a semiconductor substrate with a first active area and a second active area, the first active area being separated from the second active area by an isolation region;

forming a doped buried layer in the first active area;

forming a first floating gate on the doped buried layer of the first active area and a second floating gate on the second active area from the single layer of polysilicon;

forming a first and second doped region at opposite sides of the second floating gate in the second active area; and connecting the first floating gate and the second floating gate with a floating gate line made of conductive material.

2. The method of claim 1, further comprising the following steps before forming the doped buried layer:

forming an oxide layer upon the first active area and the second active area; and forming a polysilicon layer upon the oxide layer.

3. The method of claim 2, further comprising the following steps before forming the first floating gate and the second floating gate:

forming a tungsten silicide layer upon the polysilicon layer;

lithographing a photoresist layer upon the tungsten silicide layer for defining the first floating gate and the second floating gate;

etching the tungsten silicide layer, the polysilicon layer and the oxide layer by employing the photoresist layer as an etching mask; and stripping the photoresist layer.

4. The method of claim 1 further comprising the following steps before connecting the first floating gate and the second floating gate:

forming a dielectric layer covering the first floating gate, the second floating gate and a surface of the semiconductor substrate;

patterning the dielectric layer for defining contact holes of the first floating gate and the second floating gate;

forming a conductive layer upon the dielectric layer and;

patterning the conductive layer for shaping the floating gate line.

5. The method of claim 1, wherein the first active area is defined in an N-type doped region of the substrate.

6. The method of claim 1, wherein the second active area is defined in a P-type doped region of the substrate.

7. The method of claim 1, wherein the doped buried layer is formed by implanting N-type impurities into the first active area.

8. The method of claim 7, wherein the N-type impurities have a dosage between about $1\times10^{15}$~$2\times10^{15}$ cm$-2$.

9. The method of claim 1, wherein the first doped region and the second doped region are formed by implanting N-type impurities into the opposite sides of the second floating gate in the second active area.

10. The method of claim 9, wherein the first doped region and the second doped region have a dosage between about $8\times10^{12}$~$1.5\times10^{13}$ cm$-2$.

* * * * *